(12) United States Patent
Metzner et al.

(10) Patent No.: US 6,858,547 B2
(45) Date of Patent: Feb. 22, 2005

(54) SYSTEM AND METHOD FOR FORMING A GATE DIELECTRIC

(75) Inventors: Craig R. Metzner, Fremont, CA (US); Shreyas S. Kher, Campbell, CA (US); Shixue Han, Milpitas, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 10/256,563

(22) Filed: Sep. 27, 2002

(65) Prior Publication Data

US 2003/0232506 A1 Dec. 18, 2003

Related U.S. Application Data

(60) Provisional application No. 60/388,928, filed on Jun. 14, 2002.

(51) Int. Cl.[7] ............................................. H01L 21/31
(52) U.S. Cl. ................................................... 438/785
(58) Field of Search .............................. 438/197, 216, 438/287, 591, 773, 785, 786, 788, 798; 427/126.1, 126.3

(56) References Cited

U.S. PATENT DOCUMENTS

| | | | |
|---|---|---|---|
| 5,290,609 A | 3/1994 | Horiike et al. ............... | 427/576 |
| 6,013,553 A | 1/2000 | Wallace et al. .............. | 438/287 |
| 6,020,243 A | 2/2000 | Wallace et al. .............. | 438/287 |
| 6,060,755 A | 5/2000 | Ma et al. ..................... | 257/410 |
| 6,174,809 B1 | 1/2001 | Kang et al. .................. | 438/682 |
| 6,200,893 B1 | 3/2001 | Sneh ........................... | 438/685 |
| 6,203,613 B1 | 3/2001 | Gates et al. ................. | 117/104 |
| 6,207,487 B1 | 3/2001 | Kim et al. .................... | 438/238 |
| 6,238,734 B1 | 5/2001 | Senzaki et al. ............... | 427/226 |
| 6,270,572 B1 | 8/2001 | Kim et al. ..................... | 117/93 |
| 6,287,965 B1 | 9/2001 | Kang et al. .................. | 438/648 |
| 6,291,283 B1 | 9/2001 | Wilk ........................... | 438/216 |

(List continued on next page.)

FOREIGN PATENT DOCUMENTS

| | | | |
|---|---|---|---|
| EP | 1 146 141 | 10/2001 | ........... C23C/16/34 |
| EP | 1 170 804 | 1/2002 | ........... H01L/29/94 |

(List continued on next page.)

OTHER PUBLICATIONS

Ritala, Mikko Kalervo, Atomic Layer Epitaxy Growth of Titanium, Zirconium and Hafnium Dioxide Thin Films(Titanium Dioxide, Zirconium Dioxide), *Ann. Acad. Sci. Fenn. Sr. AII*, vol. 57/02–C of Dissertation Abstracts International, 1994, pp. 3–48.

(List continued on next page.)

*Primary Examiner*—Brook Kebede
(74) *Attorney, Agent, or Firm*—Moser, Patterson & Sheridan (57) ABSTRACT

A method of forming a dielectric stack on a pre-treated surface. The method comprises pre-cleaning a semiconductor wafer to remove native oxide, such as by applying hydroflouric acid to form an HF-last surface, pre-treating the HF-last surface with ozonated deionized water, forming a dielectric stack on the pre-treated surface and providing a flow of $NH_3$ in a process zone surrounding the wafer. Alternately, the method includes pre-treating the HF-last surface with $NH_3$, forming the stack after the pre-treating, and providing a flow of $N_2$ in a process zone surrounding the wafer after the forming. The method also includes pre-treating the HF-last surface using an in-situ steam generation process, forming the stack on the pre-treated surface, and annealing the wafer after the forming. The pre-treating includes providing an inert gas flow in a process zone surrounding the HF-last surface, reacting hydrogen with an oxidizer in the process zone for a very short duration, and providing an inert gas flew in the process zone after the reacting.

31 Claims, 7 Drawing Sheets

U.S. PATENT DOCUMENTS

| | | | |
|---|---|---|---|
| 6,297,539 B1 | 10/2001 | Ma et al. | 257/410 |
| 6,299,294 B1 | 10/2001 | Regan | 347/62 |
| 6,305,314 B1 | 10/2001 | Sneh et al. | 118/723 |
| 6,348,386 B1 | 2/2002 | Gilmer | 438/288 |
| 6,372,598 B2 | 4/2002 | Kang et al. | 438/399 |
| 6,391,785 B1 | 5/2002 | Satta et al. | 438/704 |
| 6,391,803 B1 | 5/2002 | Kim et al. | 438/787 |
| 6,395,650 B1 | 5/2002 | Callegari et al. | 438/785 |
| 6,399,491 B2 | 6/2002 | Jeon et al. | 438/680 |
| 6,416,577 B1 | 7/2002 | Suntoloa et al. | 117/88 |
| 6,420,279 B1 | 7/2002 | Ono et al. | 438/785 |
| 6,451,119 B2 | 9/2002 | Sneh et al. | 118/715 |
| 6,451,695 B2 | 9/2002 | Sneh | 438/685 |
| 6,452,229 B1 | 9/2002 | Krivokapic | 257/330 |
| 6,475,276 B1 | 11/2002 | Elers et al. | 117/84 |
| 6,475,910 B1 | 11/2002 | Sneh | 438/685 |
| 6,482,262 B1 | 11/2002 | Elers et al. | 117/84 |
| 6,599,572 B2 | 7/2003 | Saanila et al. | 427/249.18 |
| 6,620,723 B1 | 9/2003 | Byun et al. | |
| 6,674,138 B1 | 1/2004 | Halliyal et al. | |
| 2001/0000866 A1 | 5/2001 | Sneh et al. | 118/723 IR |
| 2001/0002280 A1 | 5/2001 | Sneh | 427/255.28 |
| 2001/0009695 A1 | 7/2001 | Saanila et al. | 427/255.39 |
| 2001/0021589 A1 | 9/2001 | Wilk | 438/778 |
| 2001/0024387 A1 | 9/2001 | Raaijmakers et al. | 365/200 |
| 2001/0029092 A1 | 10/2001 | Park et al. | 438/585 |
| 2001/0029891 A1 | 10/2001 | Oh et al. | 118/722 |
| 2002/0000598 A1 | 1/2002 | Kang et al. | 257/301 |
| 2002/0005556 A1 | 1/2002 | Cartier et al. | 257/381 |
| 2002/0008297 A1 | 1/2002 | Park et al. | 257/510 |
| 2002/0014647 A1 | 2/2002 | Seidl et al. | 257/301 |
| 2002/0015790 A1 | 2/2002 | Baum et al. | 427/255.28 |
| 2002/0029092 A1 | 3/2002 | Gess | 700/116 |
| 2002/0043666 A1 | 4/2002 | Parsons et al. | 257/200 |
| 2002/0064970 A1 | 5/2002 | Chooi et al. | 438/785 |
| 2002/0076837 A1 | 6/2002 | Hujanen et al. | 438/3 |
| 2002/0081826 A1 | 6/2002 | Rotondaro et al. | 438/585 |
| 2002/0081844 A1 | 6/2002 | Jeon et al. | 438/680 |
| 2002/0086111 A1 | 7/2002 | Byun et al. | 427/255.394 |
| 2002/0093046 A1 | 7/2002 | Morlya et al. | 257/315 |
| 2002/0093781 A1 | 7/2002 | Bachhofer et al. | 361/312 |
| 2002/0098627 A1 | 7/2002 | Pomarede et al. | 438/149 |
| 2002/0106536 A1 | 8/2002 | Lee et al. | 428/702 |
| 2002/0142500 A1 * | 10/2002 | Foglietti et al. | 438/22 |
| 2002/0146895 A1 | 10/2002 | Ramdani et al. | 438/497 |
| 2002/0151152 A1 | 10/2002 | Shimamoto et al. | 438/398 |
| 2002/0153579 A1 | 10/2002 | Yamamoto | 257/412 |
| 2002/0155722 A1 | 10/2002 | Satta et al. | |
| 2002/0162506 A1 | 11/2002 | Sneh et al. | 118/715 |
| 2002/0172768 A1 | 11/2002 | Endo et al. | 427/255.28 |
| 2002/0175393 A1 | 11/2002 | Baum et al. | |
| 2002/0177282 A1 | 11/2002 | Song | 438/300 |
| 2002/0182320 A1 | 12/2002 | Leskela et al. | 427/250 |
| 2002/0187256 A1 | 12/2002 | Elers et al. | 427/99 |
| 2002/0195643 A1 * | 12/2002 | Harada | 257/310 |
| 2002/0197881 A1 | 12/2002 | Ramdani et al. | 438/764 |
| 2003/0031807 A1 | 2/2003 | Elers et al. | 427/569 |
| 2003/0049931 A1 | 3/2003 | Byun et al. | |
| 2003/0049942 A1 * | 3/2003 | Haukka et al. | 438/778 |
| 2003/0060057 A1 * | 3/2003 | Raaijmakers et al. | 438/770 |
| 2003/0072975 A1 | 4/2003 | Shero et al. | 428/704 |
| 2003/0082296 A1 | 5/2003 | Elers et al. | 427/96 |
| 2003/0082301 A1 | 5/2003 | Chen et al. | |
| 2003/0089942 A1 | 5/2003 | Bhattacharyya | 257/310 |
| 2003/0096473 A1 * | 5/2003 | Shih et al. | 438/240 |
| 2003/0104710 A1 | 6/2003 | Visokay et al. | 438/798 |
| 2003/0106490 A1 | 6/2003 | Jallepally et al. | |
| 2003/0109114 A1 | 6/2003 | Niwa | 438/431 |
| 2003/0116804 A1 | 6/2003 | Visokay et al. | 257/350 |
| 2003/0133861 A1 | 7/2003 | Bowen et al. | |
| 2003/0168750 A1 | 9/2003 | Basceri et al. | |
| 2003/0173588 A1 | 9/2003 | Moriwaki et al. | 257/200 |
| 2003/0185980 A1 | 10/2003 | Endo | 427/255.23 |
| 2003/0186495 A1 | 10/2003 | Saanila et al. | 438/200 |
| 2003/0188682 A1 | 10/2003 | Tois et al. | |
| 2003/0190423 A1 | 10/2003 | Yang et al. | |
| 2003/0194853 A1 | 10/2003 | Jeon | 438/591 |
| 2003/0205729 A1 | 11/2003 | Basceri et al. | 257/200 |
| 2003/0213987 A1 | 11/2003 | Basceri et al. | |
| 2003/0227033 A1 | 12/2003 | Ahn et al. | |
| 2003/0232501 A1 | 12/2003 | Kher et al. | |
| 2003/0232506 A1 | 12/2003 | Metzner et al. | |
| 2003/0232511 A1 | 12/2003 | Metzner et al. | |
| 2003/0234417 A1 | 12/2003 | Raaijmakers et al. | |
| 2003/0235961 A1 | 12/2003 | Metzner et al. | |
| 2004/0007747 A1 | 1/2004 | Visokay et al. | |
| 2004/0009307 A1 | 1/2004 | Koh et al. | |
| 2004/0009675 A1 | 1/2004 | Elssa et al. | |
| 2004/0016973 A1 | 1/2004 | Rotondaro et al. | |
| 2004/0018723 A1 | 1/2004 | Byun et al. | |
| 2004/0018747 A1 | 1/2004 | Lee et al. | |
| 2004/0023461 A1 | 2/2004 | Ahn et al. | |
| 2004/0023462 A1 | 2/2004 | Rotondaro et al. | |
| 2004/0028952 A1 | 2/2004 | Cartier et al. | |
| 2004/0029321 A1 | 2/2004 | Ang et al. | |
| 2004/0033698 A1 | 2/2004 | Lee et al. | |
| 2004/0036111 A1 | 2/2004 | Nishikawa et al. | |
| 2004/0038554 A1 | 2/2004 | Ahn et al. | |
| 2004/0040501 A1 | 3/2004 | Vaartstra | |
| 2004/0043149 A1 | 3/2004 | Gordon et al. | |
| 2004/0043569 A1 | 3/2004 | Ahn et al. | |
| 2004/0043630 A1 | 3/2004 | Vaarstra et al. | |
| 2004/0046197 A1 | 3/2004 | Bascerl et al. | |
| 2004/0048491 A1 | 3/2004 | Jung et al. | |
| 2004/0051152 A1 | 3/2004 | Nakajima | |
| 2004/0053484 A1 | 3/2004 | Kumar et al. | |

FOREIGN PATENT DOCUMENTS

| | | | |
|---|---|---|---|
| GB | 2355727 | 5/2001 | C23C/16/44 |
| JP | 2001-111000 | 4/2001 | H01L/27/105 |
| JP | 2001-172767 | 6/2001 | C23C/16/40 |
| JP | 2002-060944 | 2/2002 | C23C/16/30 |
| JP | 2002-69641 A | 3/2002 | |
| JP | 2002-69641 | 3/2002 | C23C/16/18 |
| JP | 2002-93804 | 3/2002 | H01L/21/316 |
| JP | 2002-167672 | 6/2002 | C23C/16/18 |
| WO | 99/29924 | 6/1999 | C23C/16/04 |
| WO | 00/54320 | 9/2000 | H01L/21/44 |
| WO | WO 00/70674 | 11/2000 | H01L/21/8242 |
| WO | 01/15520 | 3/2001 | H10L/21/768 |
| WO | WO 01/25502 | 4/2001 | C23C/16/18 |
| WO | 01/27346 | 4/2001 | C23C/16/44 |
| WO | 01/27347 | 4/2001 | C23C/16/44 |
| WO | 01/29280 | 4/2001 | C23C/16/32 |
| WO | WO 01/29891 A1 | 4/2001 | |
| WO | 01/29893 | 4/2001 | H01L/21/768 |
| WO | WO 01/40541 | 6/2001 | C23C/16/40 |
| WO | 01/66832 | 9/2001 | C30B/25/14 |
| WO | WO 01/82390 | 11/2001 | H01L/51/20 |
| WO | WO 02/01628 A2 | 1/2002 | |
| WO | WO 02/09167 | 1/2002 | H01L/21/316 |
| WO | WO 02/27063 | 4/2002 | C23C/16/40 |
| WO | WO 02/43115 | 5/2002 | |
| WO | 02/45167 | 6/2002 | H01L/27/00 |

OTHER PUBLICATIONS

Balog, et al., "Chemical Vapor Deposition and Characterization of $HfO_2$ Films From Organo–Hafnium Compounds," *Thin Solid Films*, 41 (1977), pp. 247–259.

Ritala, et al., "Development of crystallinity and morphology in hafnium dioxide thin films grown by atomic layer epitaxy," *Thin Solid Films*, 250 (1994), pp. 72–80.

Kattelus, et al., "Electrical Properties of Tantalum Based Composite Oxide Films," *Mat. Res. Soc. Symp. Proc.*, 284 (1983), pp. 511–516.

Cheon, et al., "Gas Phase Photoproduction of Diatomic Metal Nitrides During Metal Nitride Laser Chemical Vapor Deposition," *Inorg. Chem.*, American Chemical Society, 38 (19999), Pag s 2238–2239.

Oshita, et al., "HfO2 growth by low–pressure chemical vapor deposition using the Hf(N(C2H5)2)4/O2 gas system," Journal of Crystal Growth, 233 (2001) pp. 292–297.

Ninisto, et al., "Synthesis of oxide thin films and overlayers by atomic layer epitaxy for advanced applications," *Materials Science and Engineering*, B41 (1996) pp. 23–29.

Hendrix, et al., "Composition control of Hf1–xSixO2 films deposited on Si by chemical–vapor deposition using amide precursors." *Applied Physics Letter*. American Journal of Physics, 80 No. 13 (Apr. 1, 2002) pp. 2362–2364.

"A Novel Atomic Layer Deposition Process to Deposit Hafnium Silicate Thin Films", Senzaki, Yoshihide, et al., Electrochemical Society Proceedings vol. 2004–01, pp 264–70.

"Nitridation of Hafnium Silicate Thin Films", Chatham, Hood; et al., Mat. Res. Soc. Symp. Proc. vol. 811, Apr. 12–16, 2004, D7.5.1.

"Interval Annealing During Alternating Pulse Deposition", Conley, J.F.; et al., Mat. Res. Soc. Symp. Proc. vol. 811, Apr. 12–16, 2004, D1.3.1.

Ritala, "Atomic Layer Epitaxy," Ann. Acad. Sci. Fenn. Ser. AII, Chemica, vol. 257 (1994).

Kukil, et al. "Tailoring the Dielectric Properties of $HfO_2$–$Ta_2O_s$ Nanolaminates," Applied Physics Letters, vol. 88, No. 26 (Jun. 24, 1996), pp. 3737–3739.

George, et al. "Surface Chemistry for Atomic Layer Growth," J. Phys. Chem. (1996), 100, 13121–13131.

Hwang, et al. "Nanometer–Size $\alpha$–$PbO_2$–type $TiO_2$ in Garnet: A Thermobarometer for Ultrahigh–Pressure Metamorphism," Science Vo. 288 (Apr. 14, 2000).

Argarwal, et al. "Challenges In Integrating the High–K Gate Dielectric Film to the Conventional CMOS Process Flow," Mat. Sec. Soc. Sump. Proc. vol. 670 (2001).

Clark–Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

* cited by examiner

SYSTEM AND METHOD FOR FORMING A GATE DIELECTRIC

BACKGROUND OF THE INVENTION

This application claims priority from U.S. Provisional Application Ser. No. 60/388,928 filed Jun. 14, 2002 entitled, "System And Method For Forming A Gate Dielectric". The foregoing patent application, which is assigned to the assignee of the present application, is incorporated herein by reference in its entirety.

FIELD OF THE INVENTION

The present invention relates generally to forming gate dielectric in field effect transistors, and particularly to forming metal oxide/metal silicate gate dielectric films using chemical vapor deposition.

DESCRIPTION OF THE RELATED ART

Figure 1:
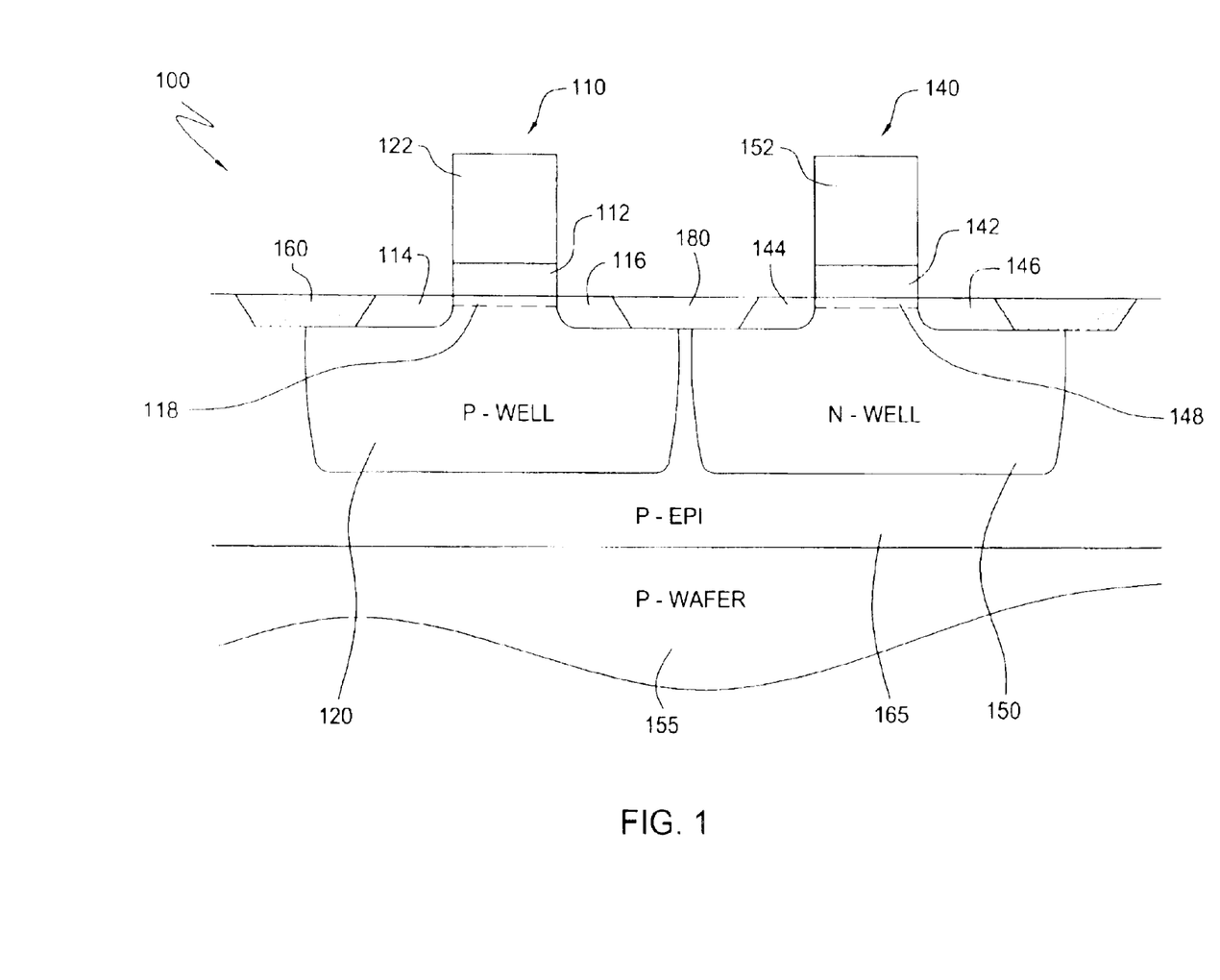
FIG. 1 illustrates portions of a cross sectional view of field effect transistor (FET) pair in a typical complimentary metal oxide semiconductor (CMOS) device.

The present invention is especially useful in forming complementary metal oxide semiconductor (CMOS) integrated-circuit devices and will be described in that context. Other applications will also be mentioned. CMOS technology has enabled the microeletronic industry to simultaneously meet several technological requirements to fuel market expansion. This has been accomplished largely by a calculated reduction (scaling) of the dimensions of the field-effect transistor (FET). FIG. 1 illustrates portions of a cross sectional view of a field effect transistor (FET) pair in a typical complimentary metal oxide semiconductor (CMOS) device. Device 100 comprises a silicon wafer 155 doped with a p-type material, a p-type epitaxial silicon layer 165 on wafer 155, a p-type well region 120 and an n-type well region 150 defined in epitaxial layer 165, an n-type transistor (NMOS FET) 110 defined in p-well 120 and a p-type transistor (PMOS FET) 140 defined in n-well 150. Region 180 electrically isolates NMOS 110 and PMOS 140 transistors and region 160 electrically isolates the pair of transistors 110 and 140 from other semiconductor devices on substrate 155.

NMOS transistor 110 comprises a gate region 122, a source region 114 and a drain region 116. The source and drain regions are n-type regions on opposite sides of gate region 122. Channel region 118 is interposed between source region 114 and drain region 116. A gate dielectric layer 112 separates channel region 118 and gate region 122. Gate dielectric 112 electrically insulates gate region 122 from channel region 118. The gate region comprises a conductor material, typically doped polycrystalline silicon (polysilicon) or amorphous silicon. The dopant may be an n-type dopant such as a phosphorus or a p-type dopant such as boron. When an appropriate voltage is applied between p-type silicon wafer 155 and gate region 122, electrons from p-well 120 move into region 118 directly below dielectric 112 thereby creating an n-type channel 118. A voltage applied between source 114 and drain 116 causes current to flow between source 114 and drain 116.

PMOS transistor 140 comprises a gate region 152, a source region 144 and a drain region 146. The source and drain regions are p-type regions on opposite sides of gate region 152. Channel region 148 is interposed between source region 144 and drain region 146. A gate dielectric 142 separates channel region 148 and gate region 152. Dielectric 142 electrically insulates gate region 152 from channel region 148. The gate region comprises a conductor material typically doped polysilicon or amorphous silicon. Again, the dopant may be an n-type or p-type material. When an appropriate voltage is applied between p-type silicon wafer 155 and gate region 152, holes from n-well 150 move into region 148 directly below dielectric layer 142 thereby creating a p-type channel 148. A voltage applied between source 144 and drain 146 causes current to flow between source 144 and drain 146.

With the rapid shrinking of the transistor feature size, the gate dielectric thickness has also decreased. For several decades, silicon dioxide has been the material of choice for the gate dielectric layer. Silicon dioxide offers a stable high-quality Si—SiO$_2$ interface and superior electrical isolation properties.

However, as the dimensions of the transistor continue to decrease, the continued use of silicon dioxide as a dielectric gate material is problematic. The fundamental problem is the need to keep the capacitance of the gate high while the area of the gate is shrinking faster than the thickness of the gate dielectric. The capacitance C of the gate is given by $C = kE_0 A/d$ where A is the area of the gate, d is the thickness of the dielectric layer, k is the dielectric constant, and $E_0$ is the permittivity of free space. In order to ensure higher gate oxide capacitance, the silicon dioxide layer thickness proportionately has been decreased to less than 2 nanometers as the area of the gate has been decreasing. However, future generations will likely require a further reduction to below 1.0 nanometer. The primary issue is that as thickness decreases, leakage current increases. This leakage in current is due primarily to the ability of the electrons to go through the thinner SiO$_2$ dielectric layer. In an example, current density for a 1.5 nanometer thick SiO$_2$ layer at 1 V is 1 A/cm$^2$; however, as the SiO$_2$ thickness decreases to 1 nanometer, the leakage-current density approaches 100 A/cm$^2$ at the same operating voltage.

Consequently, there is a need for an alternative gate dielectric material that can be used in a large enough physical thickness to reduce current leakage density and still provide a high gate capacitance. In order to achieve this, the alternative gate dielectric material must have a dielectric constant that is higher than that of silicon dioxide. Typically, the thickness of such an alternative dielectric material layer is expressed in terms of the equivalent oxide thickness (EOT). Thus, the equivalent oxide thickness (EOT) of an alternative dielectric layer in a particular capacitor is the thickness that the alternative dielectric layer would have if its dielectric constant were that of silicon dioxide.

Another consideration in selecting an alternative dielectric material is the mobility of charge carries in the transistor channel. The material selected for the dielectric film affects the mobility of the carriers in the transistor channel, thereby affecting overall transistor performance. It is desirable to find an alternative dielectric material for which the mobility of carriers in the transistor channel is equivalent to or higher than that for silicon dioxide gate dielectric films. For future generation transistors, a peak mobility of 400 cm$^2$/Vs or greater is desirable.

SUMMARY OF THE INVENTION

The present invention comprises forming a metal oxide, metal silicate, or combination metal oxide-metal silicate dielectric stack on a semiconductor wafer.

In one embodiment, the method comprises pre-treating the semiconductor wafer, e.g., to remove oxide, with hydrofluoric acid to form an HF-last surface and then pre-treating the HF-last surface with ozonated water for a specified time period. After pre-treating, a dielectric stack is formed on the pre-treated surface using a chemical vapor deposition process. A flow of $NH_3$ is then provided in a process zone surrounding the semiconductor wafer. In one embodiment, after providing the $NH_3$ flow, a polycrystalline or amorphous silicon gate is formed over the dielectric stack using a LPCVD process.

In another embodiment, the method of forming a dielectric stack on a semiconductor wafer comprises pre-treating the semiconductor wafer with hydrofluoric acid to form an HF-last surface, pre-treating the HF-last surface with $NH_3$, forming the dielectric stack on the pre-treated surface, and providing a flow of $N_2$ in a process zone surrounding the semiconductor wafer after forming the dielectric stack.

In yet another embodiment, the method of forming a dielectric stack on a semiconductor wafer comprises pre-treating the semiconductor wafer with hydrofluoric acid to form an HF-last surface, pre-treating the HF-last surface using an in-situ steam generation process, forming the dielectric stack on the pre-treated surface, and annealing the semiconductor wafer after forming the dielectric stack. The in-situ steam generation process comprises providing an inert gas flow in a process zone surrounding the HF-last surface, reacting hydrogen with an oxidizer in the process zone surrounding the HF-last surface for a very short duration, and providing an inert gas flow in the process zone after the reacting step. Preferably, the dielectric stack comprises layers of hafnium oxide, hafnium silicate layers, or a combination thereof formed using a MOCVD process.

BRIEF DESCRIPTION OF THE DRAWINGS

So that the manner in which the above recited features of the present invention, and other features contemplated and claimed herein, are attained and can be understood in detail, a more particular description of the invention, briefly summarized above, may be had by reference to the embodiments which are illustrated in the appended drawings. It is to be noted, however, that the appended drawings illustrate only typical embodiments of this invention and are therefore not to be considered limiting of its scope, for the invention may admit to other equally effective embodiments.

Additional objects and features of the invention will be more readily apparent from the following detailed description and appended claims when taken in conjunction with the drawings, in which:

DETAILED DESCRIPTION OF THE PREFERRED EMBODIMENT

Figure 2:
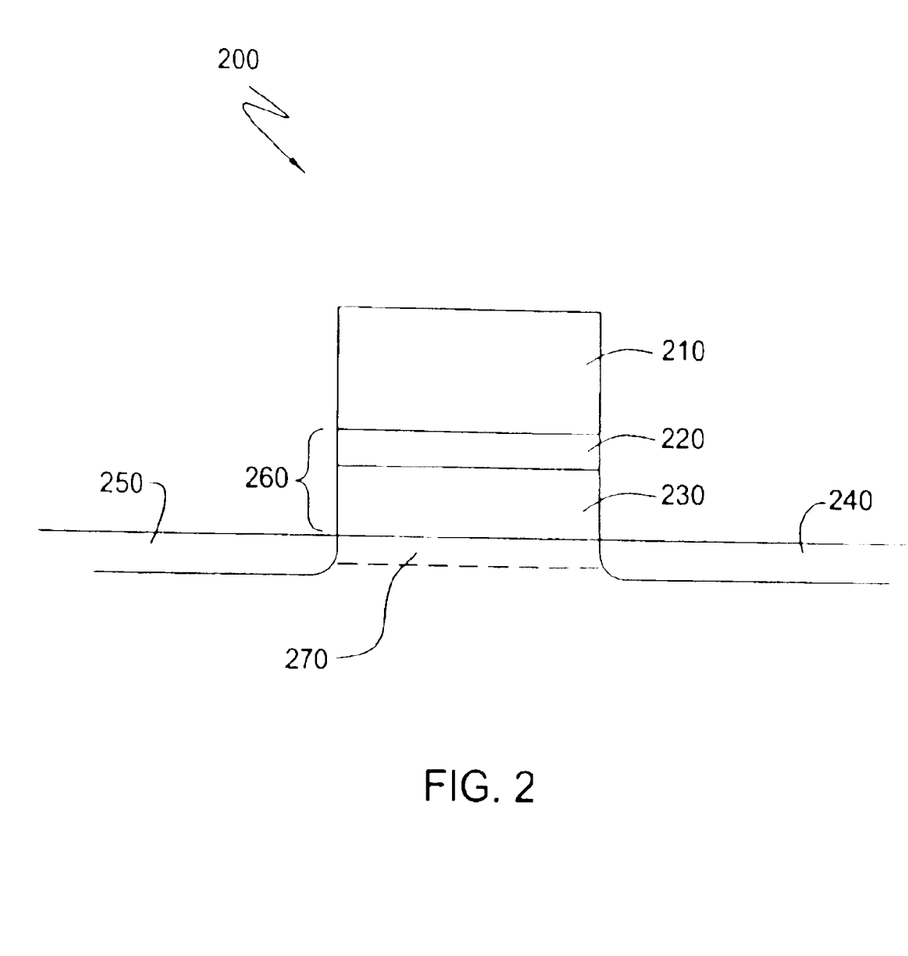
FIG. 2 illustrates a cross-sectional view of a portion of a transistor having a dielectric stack.

FIG. 2 illustrates a cross-sectional view of a portion of a field effect (FET) 200 transistor having a dielectric stack in accordance with an embodiment of the invention. FET 200 comprises a source 250, a drain 240, a gate 210, a dielectric stack 260 and a channel 270 interposed between source 250 and drain 240. Preferably, the transistor is formed on a silicon wafer and the gate is made of polycrystalline or amorphous silicon. In a PMOS FET, source 250 and drain 240 comprise a p-type silicon and in an NMOS FET, source 250 and drain 240 comprise an n-type silicon.

In one embodiment, dielectric stack 260 comprises at least two layers, where each layer comprises either a metal oxide layer or a metal silicate layer. In the embodiment shown, there is a metal oxide layer 230 and a metal silicate layer 220. The stack is formed using any metal that is capable of forming a high-k layer, e.g. $HfO_2$, $ZrO_2$. A high-k layer comprises a dielectric material having a dielectric constant greater than 4. Preferably, metal oxide layer 230 and metal silicate layer 220 comprise any metal that can form amino precursors. More preferably, metal oxide layer 230 comprises hafnium oxide and the metal silicate layer 220 comprises hafnium silicate. In one embodiment, the hafnium oxide layer thickness is about 3 nanometers and the hafnium silicate layer thickness is about 1 nanometer. Such a dielectric stack has an EOT of about 1.12 nanometers. In another embodiment, the hafnium oxide layer thickness is about 4 nanometers and hafnium silicate layer thickness is about 1.5 nanometers. Such a dielectric stack has an EOT of about 1.61 nanometers. An EOT of 1.61 nanometers provides the desired peak mobility of 400 $cm^2/Vs$. In yet another embodiment, the dielectric stack thickness is selected to provide both the desired capacitance corresponding to 1.12 nanometers EOT and the desired peak mobility of 400 $cm^2/Vs$.

EXAMPLE 1

Figure 3:
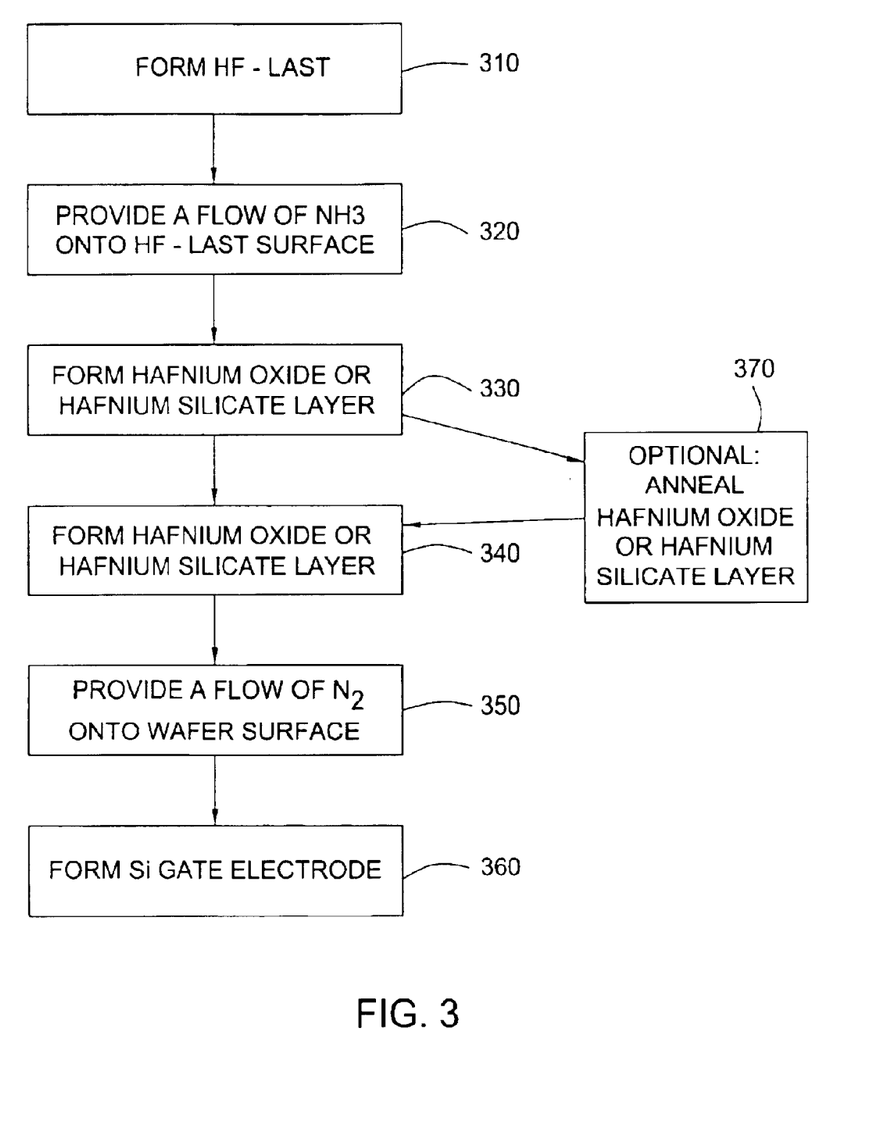
FIG. 3 illustrates the processing steps used to form a hafnium oxide and hafnium silicate gate dielectric stack.

FIG. 3 illustrates the processing steps used in accordance with the invention to form a hafnium oxide, hafnium silicate, or combination thereof gate dielectric stack having an EOT of about 1.12 nanometers. At step 310, an HF-last surface is formed on a semiconductor wafer by introducing a dilute hydrofluoric acid solution onto the wafer surface for a specified time period. In one embodiment, the wafer is immersed in a hydrofluoric acid bath for a time period of about 2 minutes to about 15 minutes. More preferably, the wafer is immersed in a 2% hydrofluoric acid bath for about 2 minutes.

Next, the wafer is placed in a thermal chamber for pre-treating at 1 to 100 torr. A step 320, $NH_3$ is introduced onto the HF-last surface for a specified time period and at a specified temperature. Step 320 adds a nitride "coating" or "layer" that aids in preventing the dopant of the gate layer (210 in FIG. 2) from diffusing into the channel (270 in FIG. 2). Preferably, the specified time period is in the range of about 5 seconds to about 120 seconds and the specified temperature is in the range of about 400° C. to about 1100° C. More preferably, the specified time period is about 30 seconds and the specified temperature is about 600° C. at 30 torr.

The wafer is then transported from the thermal chamber to a deposition chamber. A hafnium oxide or hafnium silicate layer is then formed at step 330 using deposition processes such as MOCVD, LPCVD, PECVD, VPE, ALD or PVD. Preferably, the hafnium oxide or hafnium silicate layer is formed using a MOCVD process.

If a hafnium oxide layer is preferred, $O_2$, $N_2$ and a hafnium oxide precursor are introduced onto the wafer surface. The hafnium oxide precursor is any precursor of the alkylamido or alkylamino ligand group. In one embodiment, the hafnium oxide precursor is selected from a group comprising amino or amido precursors of the form $Hf(NRR')_4$ where R=H, $CH_3$, $C_2H_5$, $C_3H_7$, CO, NCO, alkyl, and aryl and
R'=H, $CH_3$, $C_2H_5$, $C_3H_7$, CO, NCO, alkyl, and aryl.

Figure 4:
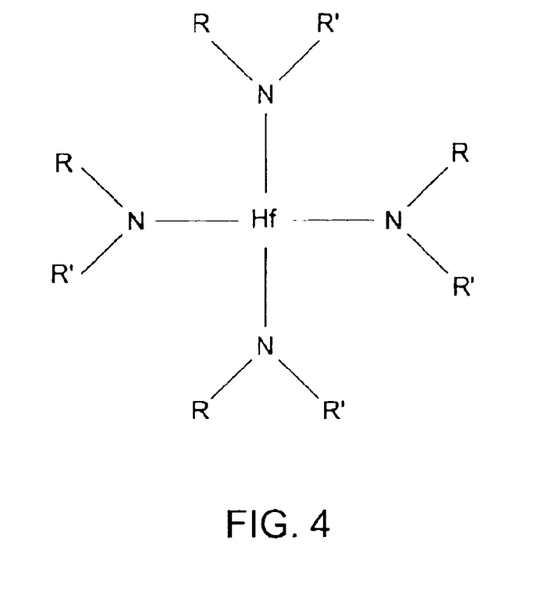
FIG. 4 illustrates the general chemical structure for the hafnium oxide precursors of the form $Hf(NRR')_4$.
Figure 5:
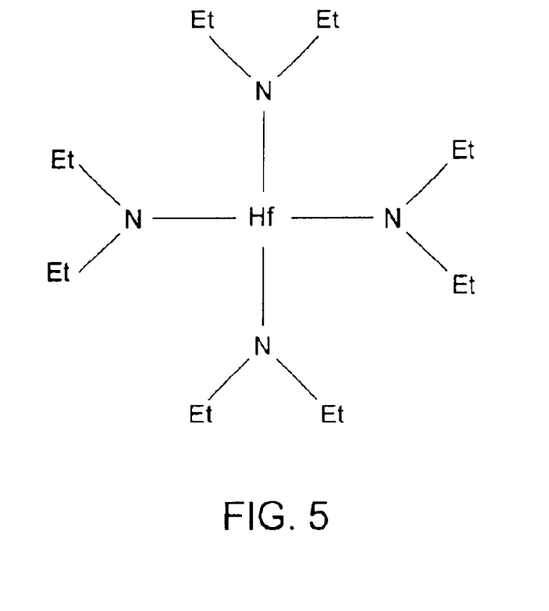
FIG. 5 illustrates the chemical structure of the TDEAH precursor.

FIG. 4 illustrates the general chemical structure for the hafnium oxide precursors of the form $Hf(NRR')_4$. Preferably, the hafnium oxide precursor is TetrakisDiEthylAmidoHafnium (TDEAH). FIG. 5 illustrates the chemical structure of the TDEAH precursor.

TDEAH is flowed onto the wafer surface at a rate in the range of about 1 mg/min to about 50 mg/min. Preferably, TDEAH is flowed onto the wafer surface at a rate of about 7 mg/min. $O_2$ is flowed onto the wafer surface at a rate in the range of about 30 sccm to about 3000 sccm. Preferably, $O_2$ is flowed onto the wafer surface at a rate of about 1000 sccm. $N_2$ is flowed onto the wafer surface at a rate in the range of about 30 sccm to about 3000 sccm. Preferably, $N_2$ is flowed onto the wafer surface at a rate of about 1500 sccm. $O_2$, $N_2$ and TDEAH are introduced onto the wafer surface either simultaneously or sequentially or a combination thereof.

The hafnium oxide layer is formed at temperatures in the range of about 225° C. to about 700° C. Preferably, the hafnium oxide layer is formed at about 485° C. The pressure in the deposition chamber is in the range of about 1.5 torr to about 8 torr. Preferably, the pressure is about 4 torr. The hafnium oxide layer formed has a thickness in the range of about 5 Å to about 50 Å. Preferably, the hafnium oxide layer formed has a thickness of about 30 Å.

In one embodiment, the wafer is transported to a second chamber after forming the hafnium oxide layer in a first chamber. The process conditions of the first chamber are then adjusted for forming the hafnium silicate layer. The wafer is then transported back to the first chamber for forming the second layer. Alternatively, the wafer can remain in the same chamber for sequential deposition of the second layer. The choice of whether to use single- or multiple-chamber deposition depends on a number of factors including the deposition process chosen for each layer (e.g., MOCVD for one layer and ALD for another or MOCVD for both layers), the capabilities or limitations of the system (transfer speed between chambers, temperature ramping capabilities), whether the wafers are being processed in a development or production environment, and/or whether an anneal process is performed between the deposition of the two dielectric layers.

Alternatively, the hafnium silicate layer may be formed at step 330 using deposition processes such as MOCVD, LPCVD, PECVD, VPE, ALD or PVD. Preferably, the hafnium silicate layer is formed using a MOCVD process, where $O_2$, $N_2$, and hafnium silicate precursors are introduced onto the wafer surface and the process temperature is about 480° C. to about 600° C. and the pressure is adjusted to about 4 torr.

The hafnium silicate precursors are precursors of the alkylamido or alkylamino ligand group. The hafnium silicate precursors are selected from precursors of the form $Hf(NRR')_4$ and $SiR_1R_2R_3R_4$ where R=H, $CH_3$, $C_2H_5$, $C_3H_7$, CO, NCO, alkyl, and aryl;
R'=H, $CH_3$, $C_2H_5$, $C_3H_7$, CO NCO, alkyl, and aryl;
$R_1$=H, $NH_2$, $N(CH_3)_2$, $N(C_2H_5)$, $N(C_3H_7)$, NCO, alkoxy, amino, alkyl and aryl;
$R_2$=H, $NH_2$, $N(CH_3)_2$, $N(C_2H_5)$, $N(C_3H_7)$, NCO, alkoxy, amino, alkyl and aryl;
$R_3$=H, $NH_2$, $N(CH_3)_2$, $N(C_2H_5)$, $N(C_3H_7)$, NCO, alkoxy, amino, alkyl and aryl; and
$R_4$=H, $NH_2$, $N(CH_3)_2$, $N(C_2H_5)$, $N(C_3H_7)$, NCO, alkoxy, amino, alkyl and aryl.

Figure 6:
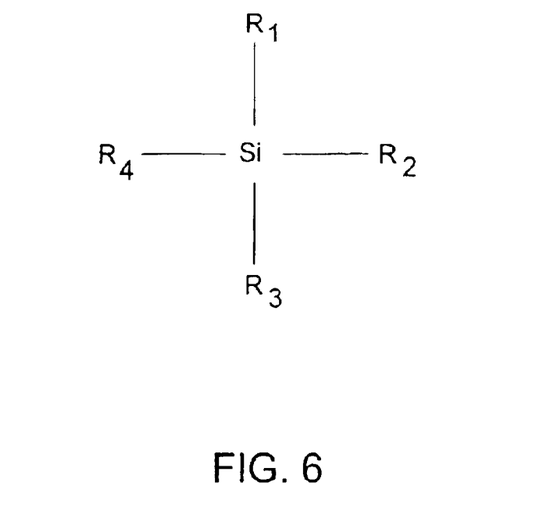
FIG. 6 illustrates the general chemical structure for precursors of the form $SiR_1R_2R_3R_4$.
Figure 7:
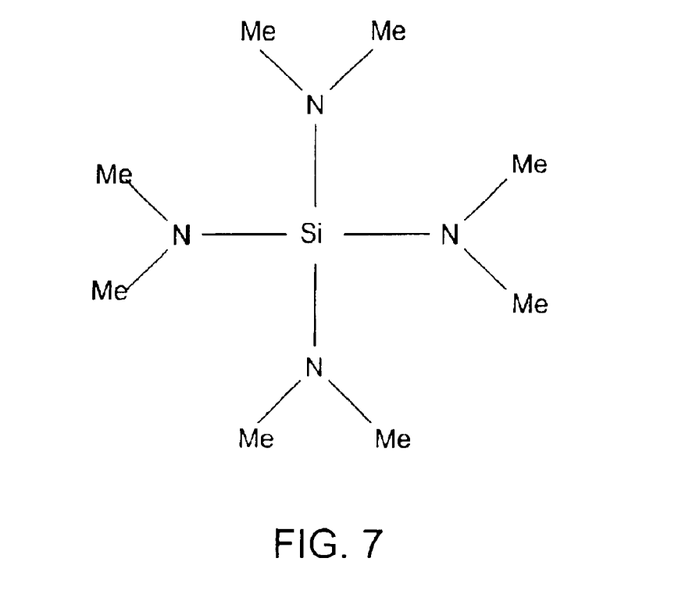
FIG. 7 illustrates the chemical structure of the TDMAS precursor.

The general chemical structure for the precursors of the form $Hf(NRR')_4$ is shown in FIG. 4. FIG. 6 illustrates the general chemical structure for precursors of the form $SiR_1R_2R_3R_4$. Preferably, the hafnium silicate precursors are TetrakisDiEthylAmidoHafnium (TDEAH) and TetrakisDiMethylAmidoSilicon (TDMAS). FIG. 7 illustrates the chemical structure of the TDMAS precursor. The chemical structure for the TDEAH precursor is shown in FIG. 5.

TDEAH is flowed onto the wafer surface at a rate in the range of about 1 mg/min to about 50 mg/min. Preferably, TDEAH is flowed onto the wafer surface at a rate of about 6 mg/min. TDMAS is flowed onto the wafer surface at a rate of about 1 mg/min to about 50 mg/min. Preferably, TDMAS is flowed at a rate of 50 mg/min. $O_2$ is flowed onto the wafer surface at a rate of about 30 sccm to about 1000 sccm, preferably about 1000 sccm, and $N_2$ is flowed onto the wafer surface at a rate of about 30 sccm to about 3000 sccm, preferably about 1500 sccm. $O_2$, $N_2$, TDEAH and TDMAS are introduced onto the wafer surface either simultaneously or sequentially or a combination thereof.

The hafnium silicate layer is formed at temperatures in the range of about 325° C. to about 700° C. and pressure is in the range of about 1.5 torr to about 8 torr. Preferably, the hafnium silicate layer is formed at about 600° C. at a pressure of about 4 torr. The hafnium silicate layer thickness is about 5–20 Å, preferably 10 Å. The $SiO_2$ concentration of the hafnium silicate layer is from about 5 mol % to about 80 mol %. More preferably, the $SiO_2$ concentration is about 10 mol %.

Thus, either a hafnium oxide or hafnium silicate layer can be formed at steps 330 and 340. Should, for example, hafnium oxide be used to form both layers, it is preferred that the hafnium oxide layers have differing compositions or stoichiometries, for example, a first layer comprised of $HfO_2$ and a second layer comprised of $Hf_2O_3$. Similarly, should both layers be comprised of hafnium silicate, it is preferable that the hafnium silicate layers have differing compositions and/or stoichiometries.

After forming the hafnium silicate layer or hafnium oxide layer at step 340, the wafer is transported back to the thermal chamber for further processing at 1 to 100 torr. At step 350, $N_2$ is introduced onto the wafer surface for a specified time period and at a specified temperature. Preferably, the specified time period is in the range of about 5 seconds to about 60 seconds at temperatures in the range of about 400° C. to about 1100° C. More preferably, $N_2$ is introduced onto the wafer surface for about 60 seconds at a temperature of about 800° C. at 10 torr.

In one embodiment, a gate electrode is next formed at step 360 on the hafnium oxide or hafnium silicate layer. The gate electrode layer may be made of polycrystalline or amorphous silicon and is formed using a chemical vapor deposition process such as MOCVD, LPCVD, PECVD, VPE, ALD or PVD. In one embodiment, the gate electrode is formed using an LPCVD process where silane or disilane is flowed onto the wafer at temperatures in the range of about 400° C. to about 900° C. Preferably, the gate electrode is formed at a temperature of about 570° C.

In some embodiments, a nitride layer may be formed on the hafnium oxide or hafnium silicate layer before formation of the polysilicon gate (i.e., to form a layer between the hafnium silicate layer 220 and the polysilicon gate 210, see FIG. 2). This embodiment is illustrated at step 850 of FIG. 8. Alternatively, for example, a nitride layer may be formed between the channel 270 and the hafnium oxide layer 220.

This embodiment is shown at step 320 of FIG. 3. The nitride layer prevents dopant diffusion from the gate electrode into the silicon channel. In such embodiments, the polysilicon gate electrode 210 is implanted with dopants such as boron and phosphorus; and the structure is then annealed at ~1000° C. for activation and distribution of the dopant in the polysilicon layer. It is undesirable for dopant to diffuse from the gate electrode layer 210 into the silicon channel 270. In small doses, such diffusion can affect threshold voltages, and in larger doses such diffusion can increase leakage currents. Either case drastically affects transistor performance.

EXAMPLE 2

Figure 8:
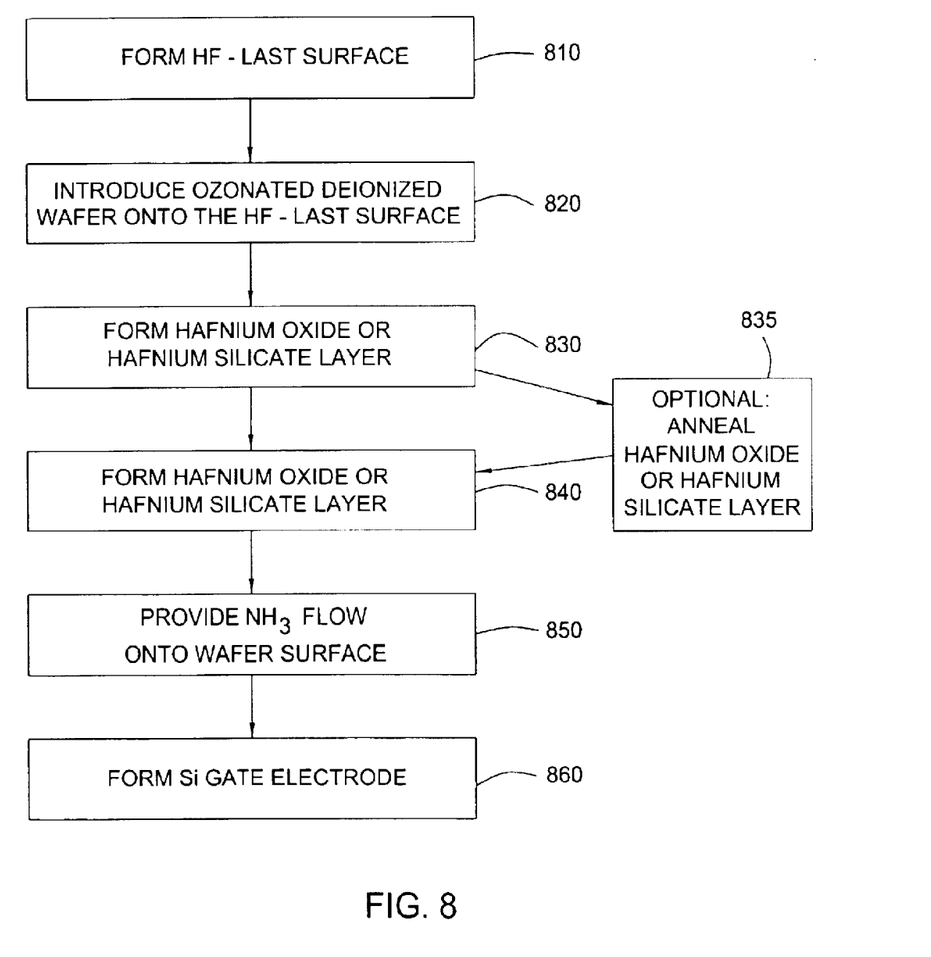
FIG. 8 illustrates the processing steps used to form a hafnium oxide and hafnium silicate gate dielectric stack.

FIG. 8 illustrates the processing steps used in accordance with the invention to form a hafnium oxide and hafnium silicate gate dielectric stack having a peak mobility of about 400 cm$^2$/Vs. At step 810, an HF-last surface is formed on a semiconductor wafer by introducing a dilute hydrofluoric acid solution onto the wafer surface for a specified time period. In one embodiment, the wafer is immersed in a hydrofluoric acid bath for a time period of about 1 minute to about 15 minutes. More preferably, the wafer is immersed in a 2% hydrofluoric acid bath for about 2 minutes.

Next, at step 820, the HF-last surface is exposed to ozonated water by, for example, immersing the wafer in an ozonated water bath. Preferably, the ozone concentration in the ozonated water is in the range of about 10 ppm to about 30 ppm. Preferably, the ozone concentration in the water is about 20 ppm. Preferably, the HF-last surface is exposed to the ozonated water for about 5 minutes to about 15 minutes. More preferably, the HF-last surface is exposed to the ozonated water for about 10 minutes.

The wafer is next placed in a deposition chamber. A hafnium oxide layer is then formed at step 830 using deposition processes such as MOCVD, LPCVD, PECVD, VPE, ALD or PVD. Preferably, the hafnium oxide layer is formed using a MOCVD process.

$O_2$, $N_2$ and a hafnium oxide precursor are introduced onto the wafer surface. The hafnium oxide precursor is any precursor of the alkylamido or alkylamino ligand group. In one embodiment, the hafnium oxide precursor is selected from a group comprising amino or amido precursors of the form Hf(NRR')$_4$ where R=H, CH$_3$, C$_2$H$_5$, C$_3$H$_7$, CO, NCO, alkyl, and aryl and
R'=H, CH$_3$, C$_2$H$_5$, C$_3$H$_7$, CO, NCO, alkyl, and aryl.

FIG. 4 illustrates the general chemical structure for the hafnium oxide precursors of the form Hf(NRR')$_4$. Preferably, the hafnium oxide precursor is TetrakisDiEthylAmidoHafnium (TDEAH). FIG. 5 illustrates the chemical structure of the TDEAH precursor.

TDEAH is flowed onto the wafer surface at a rate of about 1 mg/min to about 50 mg/min, preferably about 7 mg/min, $O_2$ is flowed onto the wafer surface from about 30 sccm to about 3000 sccm, preferably 30 sccm, and $N_2$ is flowed onto the wafer surface at a rate of about 30 sccm to about 3000 sccm, preferably about 1500 sccm. $O_2$, $N_2$ and TDEAH are introduced onto the wafer surface either simultaneously or sequentially or a combination thereof.

The hafnium oxide layer is formed at temperatures in the range of about 225° C. to about 700° C., preferably, at about 485° C. The pressure in the deposition chamber is in the range of about 3 torr to about 8 torr, preferably about 4 torr. Preferably, the hafnium oxide layer formed has a thickness of about 2–5 nanometers, and preferably about 4 nanometers.

After forming the hafnium oxide layer, the wafer is transported from the deposition chamber another chamber. For example, the chamber may be an anneal chamber, a cooldown chamber or a loadlock chamber. Preferably, an anneal step is performed between deposition of the hafnium oxide layer and the hafnium silicate layer. Once the wafer is transferred, the temperature and pressure in the first deposition chamber are adjusted for forming the hafnium silicate layer. For an MOCVD process, the temperature is adjusted to about 600° C. and the pressure is adjusted to about 4 torr. The wafer is then transported from the cooldown chamber to the deposition chamber. A hafnium silicate layer is then formed at step 840 using deposition processes such as MOCVD, LPCVD, PECVD, VPE, ALD or PVD. In another embodiment, the wafer is not transported to another chamber after forming the hafnium oxide layer, but the wafer remains in the deposition chamber while the process conditions of the deposition chamber are adjusted for forming the hafnium silicate layer. In this case, ramping the temperature from the processing temperature of the hafnium oxide processing conditions to the temperature of the hafnium silicate processing conditions provides an anneal-like environment and a separate anneal step may be eliminated.

Preferably, the hafnium silicate layer is formed using a MOCVD process. $O_2$, $N_2$, and hafnium silicate precursors are introduced onto the wafer surface. The hafnium silicate precursors are precursors of the alkylamido or alkylamino ligand group. The hafnium silicate precursors are selected from precursors of the form Hf(NRR')$_4$ and SiR$_1$R$_2$R$_3$R$_4$ where R=H, CH$_3$, C$_2$H$_5$, C$_3$H$_7$, CO, NCO, alkyl, and aryl;
R=H, CH$_3$, C$_2$H$_5$, C$_3$H$_7$, CO NCO, alkyl, and aryl;
R$_1$=H, NH$_2$, N(CH$_3$)$_2$, N(C$_2$H$_5$), N(C$_3$H$_7$), NCO, alkoxy, amino, alkyl and aryl;
R$_2$=H, NH$_2$, N(CH$_3$)$_2$, N(C$_2$H$_5$), N(C$_3$H$_7$), NCO, alkoxy, amino, alkyl and aryl;
R$_3$=H, NH$_2$, N(CH$_3$)$_2$, N(C$_2$H$_5$), N(C$_3$H$_7$), NCO, alkoxy, amino, alkyl and aryl; and
R$_4$=H, NH$_2$, N(CH$_3$)$_2$, N(C$_2$H$_5$), N(C$_3$H$_7$), NCO, alkoxy, amino, alkyl and aryl.

The general chemical structure for the precursors of the form Hf(NRR')$_4$ is shown in FIG. 4. FIG. 6 illustrates the general chemical structure for precursors of the form SiR$_1$R$_2$R$_3$R$_4$. Preferably, the hafnium silicate precursors are TetrakisDiEthylAmidoHafnium (TDEAH) and TetrakisDiMethylAmidoSilicon (TDMAS). FIG. 7 illustrates the chemical structure of the TDMAS precursor. The chemical structure for the TDEAH precursor is shown in FIG. 5.

TDEAH is flowed onto the wafer surface at a rate of about 1 mg/min to about 50 mg/min, preferably about 6 mg/min, TDMAS is flowed onto the wafer surface at a rate of about 1 mg/min to about 50 mg/min, preferably about 10 mg/min, $O_2$ is flowed onto the wafer surface at a rate of about 30 sccm to about 3000 sccm, preferably about 1000 sccm, and $N_2$ is flowed onto the wafer surface at a rate of about 30 sccm to about 3000 sccm, preferably about 1500 sccm. $O_2$, $N_2$, TDEAH and TDMAS are introduced onto the wafer surface either simultaneously or sequentially or a combination thereof.

The hafnium silicate layer is formed at temperatures in the range of about 325° C. to about 700° C. and at pressure in the range of about 3 torr to about 8 torr. Preferably, the hafnium silicate layer is formed at about 600° C. at a pressure of about 4 torr. The hafnium silicate layer thickness is from 5 to 20 Å, preferably about 1.5 nanometers. The SiO$_2$ concentration of the layer is about 5–80 mol %, preferably about 45 mol % to about 50 mol %. More preferably, the SiO$_2$ concentration is about 50 mol %.

After forming the hafnium silicate layer, the wafer is transported from the deposition chamber to the thermal chamber for further processing. At step 850 $NH_3$ is then introduced onto the wafer surface at 1 to 100 torr for a specified time period and a specified temperature. Preferably, the specified time period is in the range of about 5 seconds to about 60 seconds. More preferably, the specified time period is about 60 seconds. Preferably, the specified temperature is in the range of about 400° C. to about 1100° C. More preferably, the specified temperature is about 700° C. at 30 torr.

In one embodiment, a polycrystalline-Si or amorphous-Si gate electrode is next formed at step 860 on the hafnium silicate layer. The gate electrode layer is formed using a chemical vapor deposition process such as MOCVD, LPCVD, PECVD, VPE, ALD or PVD. In one embodiment, the gate electrode is formed using an LPCVD process where silane or disilane is flowed onto the wafer at temperatures in the range of about 400° C. to about 900° C. Preferably, the gate electrode is formed at a temperature of about 550° C. As described supra, to avoid undesired dopant diffusion from the gate electrode into the silicon channel, the wafer may be treated with $NH_3$ (step 850 of FIG. 8) after deposition of the dielectric layer 220 and before deposition of the polysilicon gate 210 (layers shown in FIG. 3). Such a treatement forms a nitride coating or layer that prevents dopant diffusion. Alternately, a nitride layer may be formed between the dielectric layer 230 and the silicon channel 270 by treating the wafer with $NH_3$ (FIG. 3, step 330) after formation of the Hf-last.

As described previously, as an alternative to forming first a hafnium oxide layer then forming a hafnium silicate layer, two hafnium oxide layers may be used or two hafnium silicate layers may be used, or first a hafnium silicate layer followed by a hafnium oxide layer may be used. Optionally, a third layer may be formed over the second layer as just described, Such a third layer would comprise hafnium silicate.

Gate Formation Using a Flash In-Situ Steam Generation (ISSG) Process

In the flash in-situ steam generation (ISSG) process in accordance with the invention, the reactants, hydrogen and an oxidizer, are introduced onto an HF-last wafer surface for a very short duration to form hydroxyl groups and water vapor in the thermal chamber The hydroxyl groups then bond to the HF-last surface, thereby enhancing high-k nucleation. In accordance with the invention, the growth of interfacial $SiO_2$ between the silicon channel and the hafnium oxide layer is minimized due to a very short flash in-situ steam generation process and by introducing inert gases before and after the flash ISSG process.

Figure 9:
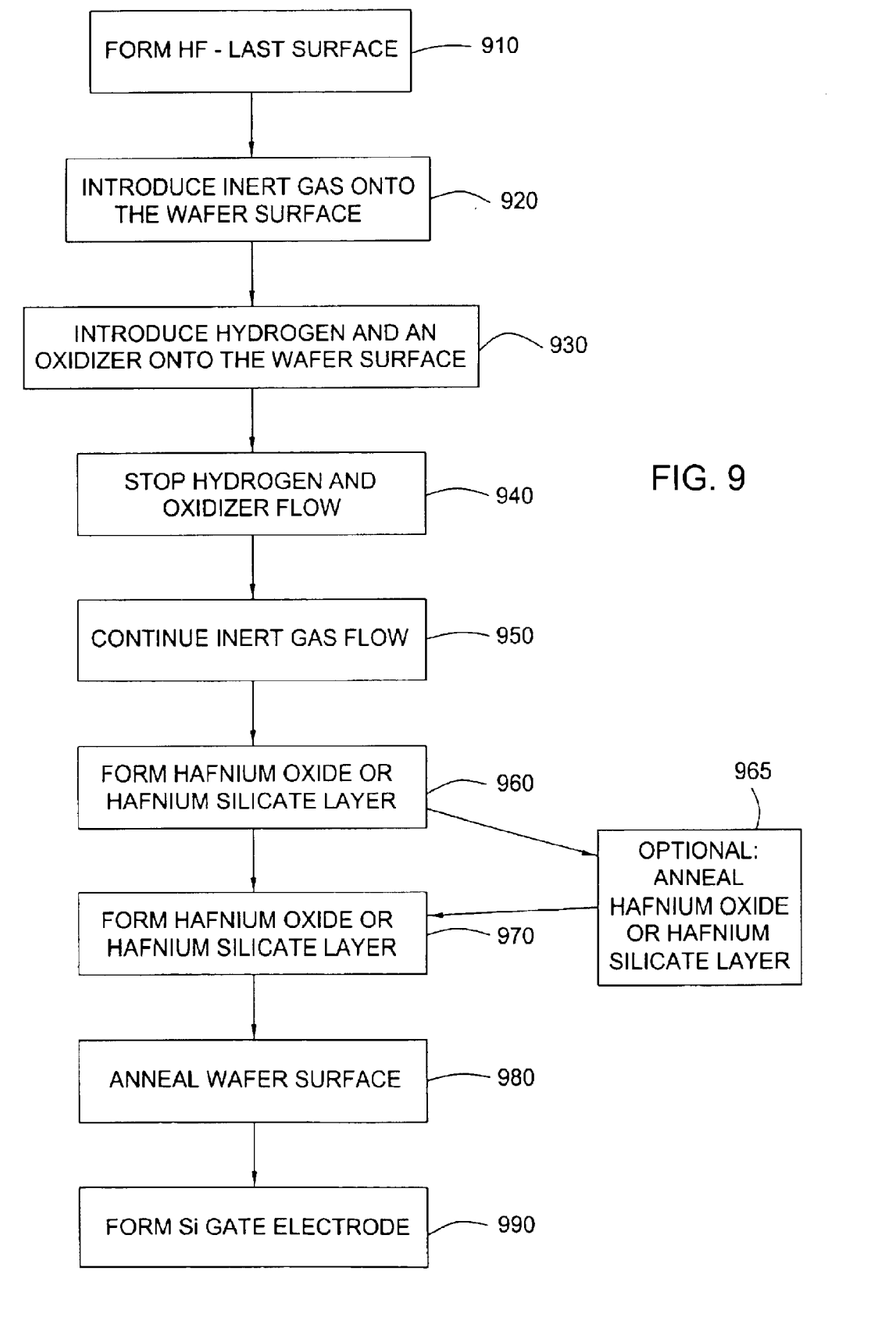
FIG. 9 illustrates the processing steps that may be used for forming the dielectric stack using a flash in-situ steam generation (ISSG) pre-treatment process.

FIG. 9 illustrates the processing steps that may be used in accordance with the invention for forming the dielectric stack using a flash in-situ steam generation (ISSG) pretreatment process. At step 910, an HF-last surface is formed on a semiconductor wafer by introducing a dilute hydrofluoric acid solution onto the wafer surface for a specified time period. In one embodiment, the wafer is immersed in a hydroflouric acid bath for a time period of about 1 minute to about 15 minutes. More preferably, the wafer is immersed in a 2% hydroflouric acid bath for about 2 minutes.

After the HF-last processing, the wafer is placed in a thermal chamber. The HF-last surface is then pre-treated using a flash ISSG process. First, at step 920, an inert gas such as helium or nitrogen is introduced into the chamber for a specified time period. Then, at step 930, the reactants, hydrogen and an oxidizer such as $O_2$ or $N_2O$, are introduced into the chamber for a very short duration. The flow of reactants is then stopped at step 940 while the inert gas continues to flow onto the wafer surface at step 950. Table 1 provides some illustrative temperatures, flow rates and reactant flow times for a flash ISSG process.

TABLE I

| | Temp. (° C.) | $H_2$ (sccm) | Oxidizer (sccm) | He (sccm) | Reactamt Flow Time(s) |
|---|---|---|---|---|---|
| Example 1 | 750 | 8 | 2980 ($O_2$) | 2980 | 6 |
| Example 2 | 750 | 15 | 2980 ($N_2O$) | 2980 | 6 |
| Example 3 | 750 | 15 | 2980 ($O_2$) | 2980 | 6 |
| Example 4 | 800 | 5 | 1000 ($O_2$) | 0 | 3 |
| Example 5 | 800 | 5 | 1000 ($N_2O$) | 0 | 3 |

After the pre-treating, the wafer is transported to a deposition chamber. A metal oxide and a metal silicate layer are then formed on the pre-treated surface. Preferably, any metal that forms amino precursors, including alkoxides or halides, may be used to form the metal oxide and metal silicate layers. In one embodiment, hafnium oxide and hafnium silicate layers are formed at steps 960 and 970 using the processes described earlier in reference to FIGS. 3 and 8. Table 2 provides illustrative parameters for forming the hafnium oxide and hafnium silicate layers.

TABLE 2

| | Hf (mg/min) | Si (mg/min) | $O_2$ (sccm) | $N_2$ (sccm) | Temp. (° C.) | Pressure (Torr) |
|---|---|---|---|---|---|---|
| Example 6 | 7 | 0 | 1000 | 1500 | 485 | 4 |
| Example 7 | 6 | 50 | 1750 | 750 | 425 | 3 |
| Example 8 | 6 | 50 | 1750 | 750 | 525 | 5.5 |
| Example 9 | 6 | 50 | 1750 | 750 | 575 | 8 |

After forming the metal oxide and metal silicate layers, the wafer is transported from the deposition chamber to the thermal chamber for post-deposition processing. In one embodiment, the post-deposition processing comprises the post-treatment processes described earlier in reference to FIGS. 3 and 8. In another embodiment, the post-deposition processing comprises annealing the wafer surface at step 980 in a thermal or plasma environment using $H_2$, $O_2$, $N_2O$, NO, $NH_3$, $O_3$, $N_2$, He or a combination thereof.

In one embodiment, a polycrystalline-Si or amorphous-Si gate electrode is next formed at step 990 after post-deposition processing. The gate electrode layer is formed using a deposition process such as MOCVD, LPCVD, PECVD, VPE, ALD or PVD. In one embodiment, the gate electrode is formed using an LPCVD process where silane or disilane is flowed onto the wafer at temperatures in the range of about 400° to about 900°. Preferably, the gate electrode is formed at a temperature of about 550° C. To avoid undesired dopant diffusion, a nitride layer may be formed between the dielectric layer 220 and the polysilicon gate 210 prior to formation of the polysilicon gate. Alternately, a nitride layer may be formed between the dielectric layer 230 and the silicon channel 260.

Various modifications may occur to those skilled in the art without departing from the true spirit and scope of the invention as defined by the appended claims. For example, although the specific embodiments are described using a hafnium oxide and hafnium silicate dielectric gate stack, those skilled in the art will appreciate that the dielectric stack may be formed using any metal that is capable of forming films with the desired capacitance and mobility.

Additionally, although the specific embodiments use metal oxide and metal silicate films, other film compositions that provide the desired capacitance and mobility may also be used to form the dielectric stack.

While the foregoing is directed to embodiments of the present invention, other and further embodiments of the invention may be devised without departing from the basic scope thereof, and the scope thereof is determined by the claims that follow.

What is claimed is:

1. A method of forming a dielectric stack on a wafer comprising:
    treating the wafer with hydrofluoric acid to form an HF-last surface;
    pre-treating the HF-last surface with ozonated deionized water for a specified time period to form a pre-treated surface;
    forming the dielectric stack on the pre-treated surface, wherein the dielectric stack comprises a hafnium oxide layer or a hafnium silicate layer; and
    providing a flow of $NH_3$ in a process zone surrounding the wafer after forming the dielectric stack.

2. A method of forming a dielectric stack on a wafer comprising:
    treating the wafer with hydrofluoric acid to form an HF-last surface;
    pre-treating the HF-last surface with ozonated deionized water for a specified time period to form a pre-treated surface;
    forming the dielectric stack on the pre-treated surface; and
    providing a flow of $NH_3$ in a process zone surrounding the wafer after forming the dielectric stack, wherein forming the dielectric stack comprises:
        forming a first layer of hafnium oxide or hafnium silicate on the pre-treated surface, and
        forming a second layer of hafnium oxide or hafnium silicate on the first layer.

3. The method of claim 2 wherein forming the dielectric stack further comprises an annealing step between the forming steps.

4. The method of claim 2, wherein the first layer is hafnium oxide and the second layer is hafnium silicate.

5. The method of claim 2 wherein the first and second layers are formed using metal-organic chemical vapor deposition (MOCVD) process.

6. The method of claim 4 wherein
    the hafnium oxide layer is formed using TetrakisDiethylamidoHafnium (TDEAH) precursor; and
    the hafnium silicate layer is formed using TetrakisDiethylamidoHafnium (TDEAH) and TetrakisDimethylamidoSilicon (TDMAS) precursors.

7. The method of claim 6 wherein:
    the ozonated deionized water has an $O_3$ concentration that is in the range of about 10 ppm to about 30 ppm;
    the specified time period for pre-treating is in the range of about 5 minutes to about 15 minutes;
    the hafnium oxide layer is formed at a pressure in the range of about 2 torr to about 8 torr and at a temperature in the range of 225° C.–700° C.;
    the hafnium silicate layer is formed at a temperature in the range of 225° C.–700° C. and at a pressure in the range of about 3 torr to about 8 torr; and
    the flow of $NH_3$ is provided at a temperature in the range of about 400° C. to about 1100° C. for about 5 seconds to about 60 seconds.

8. The method of claim 7 wherein the dielectric stack has an effective oxide thickness (EOT) of less than about 1.7 nanometers.

9. The method of claim 7 wherein the dielectric stack has an effective oxide thickness (EOT) of less than about 1.25 nanometers.

10. The method of claim 6 wherein:
    the ozonated deionized water has an $O_3$ concentration that is about 20 ppm;
    the specified time period for pre-treating is about 10 minutes;
    the hafnium oxide layer is formed at a temperature of about 485° C. and at a pressure of about 4 torr;
    the hafnium silicate layer is formed at a temperature of about 600° C. and at a pressure of about 4 torr; and
    the flow of $NH_3$ is provided for about 60 seconds at a temperature of about 700° C.

11. The method of claim 6 wherein the hafnium oxide layer is about 4 nanometers thick, the hafnium silicate layer is about 1.5 nanometers thick.

12. The method of claim 6 wherein the hafnium silicate layer comprises about 50% $SiO_2$.

13. The method of claim 2 wherein the first and second layers are formed using alkylamido or alkylamino ligand precursors.

14. The method of claim 2 wherein the hafnium oxide precursors are selected from a group consisting of amino or amido precursors of the form, $Hf(NRR')_4$, wherein R is alkyl and R' is alkyl and the hafnium silicate precursors are selected from a group consisting of amino or amido precursors of the form $SiR_1R_2R_3R_4$ where
    $R_1$=H, $NH_2$, $N(CH_3)_2$, NCO, alkoxy, amino, alkyl, or aryl;
    $R_2$=H, $NH_2$, $N(CH_3)_2$, NCO, alkoxy, amino, alkyl, or aryl;
    $R_3$=H, $NH_2$, $N(CH_3)_2$, NCO, alkoxy, amino, alkyl, or aryl; and
    $R_4$=H, $NH_2$, $N(CH_3)_2$, NCO, alkoxy, amino, alkyl, or aryl.

15. The method of claim 2 wherein the hafnium oxide and the hafnium silicate layers are formed using MOCVD, LPCVD, PECVD, VPE, ALD or PVD.

16. The method of claim 1 further comprising:
    removing the wafer from a first chamber to a second chamber after forming the hafnium oxide layer;
    adjusting a temperature and a pressure of the first chamber; and
    returning the wafer to the first chamber after adjusting the temperature and the pressure of the first chamber.

17. A method of forming a dielectric stack on a wafer comprising:
    treating the wafer with hydrofluoric acid to form an HF-last surface;
    pre-treating the HF-last surface with ozonated deionized water for a specified time period to form a pre-treated surface;
    forming the dielectric stack on the pre-treated surface wherein the dielectric stack comprises a hafnium oxide layer or a hafnium silicate layer;
    providing a flow of $NH_3$ in a process zone surrounding the wafer after forming the dielectric stack;
    transporting the wafer to a LPCVD chamber after providing the flow of $NH_3$; and forming a polycrystalline-Si layer or an amorphous-Si layer over the dielectric stack.

18. The method of claim 17 wherein the polycrystalline-Si layer or the amorphous-Si layer is formed by introducing silane or disilane in a process zone surrounding the wafer at a specified temperature.

19. The method of claim 18 wherein the specified temperature is less than about 600°C.

20. The method of claim 16 wherein the temperature is in a range from about 400° C. to about 1100° C.

21. The method of claim 20 wherein forming the dielectric stack comprises:

forming a first layer of hafnium oxide or hafnium silicate on the pre-treated surface; and forming a second layer of hafnium oxide or hafnium silicate on the first layer.

22. The method of claim 21 wherein forming the dielectric stack further comprises an annealing step between the forming steps.

23. The method of claim 21, wherein the second layer comprises hafnium silicate.

24. The method of claim 21 wherein the first and second layers are formed using LPCVD, PECVD, VPE, ALD or PVD.

25. The method of claim 21 wherein the first and second layers are formed using pulsed CVD.

26. The method of claim 21, wherein the first layer comprises hafnium oxide and the second layer comprises hafnium silicate.

27. The method of claim 26 wherein the hafnium oxide layer is formed using TetrakisDiethylamidoHafnium (TDEAH) precursor; and the hafnium silicate layer is formed using TetrakisDiethylamidoHafnium (TDEAH) and TetrakisDimthylamidoSilicon (TDMAS) precursors.

28. The method of claim 27 wherein a specified duration for providing a flow of $NH_3$ is in the range of about 5 seconds to about 60 seconds;

a specified temperature for providing a flow of $NH_3$ is in the range of about 400° C. to about 1100° C.;

the hafnium oxide layer is formed at a pressure in the range of about 2 torr to about 8 torr and at a temperature in the range of 225° C.–700° C.;

the hafnium silicate layer is formed at a temperature in the range of 225° C.–700° C. and at a pressure in the range of about 3 torr to about 8 torr; and a the flow of $N_2$ is provided for about 5 seconds to about 60 seconds and at a temperature in the range of about 400° C. to about 1100° C.

29. The method of claim 28 wherein the specified duration for providing a flow at $NH_3$ is about 60 seconds;

the specified temperature for providing a flow of $NH_3$ is about 700° C.;

the hafnium oxide layer is formed at a pressure of about 4 torr and at a temperature of about 485° C.;

the hafnium silicate layer is formed at a temperature of about 600° C. and at a pressure of about 4 torr; and the flow of $N_2$, is provided for about 60 seconds and at a temperature of about 800° C.

30. The method of claim 26 where the hafnium oxide layer is annealed before the hafnium silicate layer is formed.

31. The method of claim 26 wherein the hafnium oxide layer is about 3 nanometers thick, the hafnium silicate layer is about 1.0 nanometer thick and the hafnium silicate layer comprises about 50% $SiO_2$.

* * * * *